United States Patent [19]

Azuma et al.

[11] Patent Number: 5,620,739
[45] Date of Patent: Apr. 15, 1997

[54] THIN FILM CAPACITORS ON GALLIUM ARSENIDE SUBSTRATE AND PROCESS FOR MAKING THE SAME

[75] Inventors: Masamichi Azuma; Carlos A. Paz De Araujo; Michael C. Scott, all of Colorado Springs, Colo.; Toshiyuki Ueda, Nara, Japan

[73] Assignees: Symetrix Corporation, Colorado Springs, Colo.; Matsushita Electronics Corporation, Osaka, Japan

[21] Appl. No.: 214,401

[22] Filed: Mar. 17, 1994

Related U.S. Application Data

[63] Continuation-in-part of Ser. No. 165,082, Dec. 10, 1993, abandoned, which is a continuation-in-part of Ser. No. 132,744, Oct. 6, 1993, Pat. No. 5,514,822, which is a continuation-in-part of Ser. No. 993,380, Dec. 18, 1992, Pat. No. 5,456,945, which is a continuation-in-part of Ser. No. 660,428, Feb. 25, 1991, abandoned.

[51] Int. Cl.$^6$ .................. B05D 5/12; B05D 3/02
[52] U.S. Cl. .............. 427/79; 427/96; 427/226; 427/126.3
[58] Field of Search ............... 427/79, 226, 96, 427/126.3; 437/919; 257/295, 296

[56] References Cited

U.S. PATENT DOCUMENTS

| | | | |
|---|---|---|---|
| 4,963,390 | 10/1990 | Lipeles et al. | 427/110 |
| 5,046,043 | 9/1991 | Miller et al. | 257/295 |
| 5,122,477 | 6/1992 | Wolters et al. | 437/60 |
| 5,122,923 | 6/1992 | Matsubara et al. | 361/321 |
| 5,160,762 | 11/1992 | Hans-Wolfgan Brand et al. | 427/79 |
| 5,198,269 | 3/1993 | Swartz et al. | 427/226 |
| 5,217,754 | 6/1993 | Santiago-Aviles et al. | 427/226 |
| 5,271,955 | 12/1993 | Maniar | 427/100 |

FOREIGN PATENT DOCUMENTS

| | | |
|---|---|---|
| 2-50973 | 2/1990 | Japan . |
| 2-239103 | 9/1990 | Japan . |

OTHER PUBLICATIONS

J. V. Mantese, et al.; Metalorganic Deposition(MOD): A Nonvacuum, Spin–on, Liquid–Based, Thin Film Method; MRS Bulletin; Oct. 1989; pp. 48–53.

Robert W. Vest, et al.; PbTiO$_3$ Films From Metalloorganic Precursors; IEEE Transactions on Ultrasonics, Ferroelectrics, and Frequency Control; vol. 35, No. 6; Nov. 1988; pp. 711–717.

G. M. Vest, et al.; Synthesis of Metallo–Organic Compounds for MOD Powders and Films; Materials Research Society Symposium; vol. 60; 1986; pp. 35–42.

Kuniaki Koyama, et al.; A Stacked Capacitor With $(Ba_xSr_{1-x})TiO_3$ For 256M DRAM; IEDM; Dec. 1991; pp. 32.1.1–32.1.4.

L.E. Sanchez, et al.; Process Technology Developments for GaAs Ferroelectric Nonvolatile Memory; McDonnell Douglas Electronic Systems Company 1992 no page number available.

L.D. McMillan, et al.; Deposition of $Ba_{1-x}TiO_3$ and $SrTiO_3$ Via Liquid Source CVD (LSCVD) for ULSI DRAMS; ISIF Conference; Mar. 1992.

Fujii et al, IEDM Technical Digest, 1992; pp. 10.3.1–10.3.4.

Azuma et al., "Electrical Characteristics of High Dielectric Constant Materials For Integrated Ferroelectrics", ISIF, 1992, pp. 109–117.

Noma, Atsushi "Evolution of GaAs ICs Containing Ferroelectric Capacitor", JEE Jun., 1993, No. 3, pp. 101–104.

*Primary Examiner*—Roy V. King
*Attorney, Agent, or Firm*—Duft, Graziano & Forest, P.C.

[57] ABSTRACT

A silicon nitride barrier layer is deposited on a gallium arsenide substrate to prevent evaporation of the substrate in subsequent heating steps. A silicon dioxide stress reduction layer is deposited on the barrier layer. A first electrode is formed on the stress reduction layer, then a liquid precursor is spun on the first electrode, dried at about 400° C., and annealed at between 600° C. and 850° C. to form a BST capacitor dielectric. A second electrode is deposited on the dielectric and annealed.

16 Claims, 2 Drawing Sheets

THIN FILM CAPACITORS ON GALLIUM ARSENIDE SUBSTRATE AND PROCESS FOR MAKING THE SAME

This application is a continuation-in-part of U.S. patent application Ser. No. 08/165,082 filed Dec. 10, 1993; abandoned which in turn is a continuation-in-part of U.S. patent application Ser. No. 08/132,744 filed Oct. 6, 1993 and now issued as U.S. Pat. No. 5,514,822; which in turn is a continuation-in-part of U.S. patent application Ser. No. 07/993,380 filed Dec. 18, 1992 and now issued as U.S. Pat. No. 5,456,945, which is in turn a continuation-in-part of U.S. patent application Ser. No. 07/660,428 filed Feb. 25, 1991 now abandoned.

BACKGROUND OF THE INVENTION

1. Field of the Invention

The invention in general relates to the fabrication of integrated circuits utilizing metal oxides, such as barium strontium titanate, and more particularly to the fabrication of thin film capacitors on gallium arsenide substrates.

2. Statement of the Problem

Metal oxide materials, such as barium strontium titanate, commonly referred to as BST, are known to be useful in making integrated circuit thin film capacitors having high dielectric constants. See for example, Kuniaki Koyama, et al., "A Stacked Capacitor With $(Ba_xSr_{1-x})TiO_3$ For 256M DRAM" in *IDEM(International Electron Devices Meeting) Technical Digest*, December 1991, pp. 32.1.1–32.1.4, and U.S. Pat. No. 5,122,923 issued to Shogo Matsubara et al. In both of these references, the BST capacitors are fabricated on a silicon substrate. While the results were good at low frequencies, i.e., about 10 megahertz, up to now, metal oxide thin film capacitors having high capacitance at high frequencies, i.e., at frequencies of 1 gigahertz and higher, have not been possible.

It has been shown that a PZT ferroelectric RAM can be fabricated on gallium arsenide substrate, and further that silicon nitride (SIN) is effective in encapsulating the GaAs to prevent contamination of the PZT. See "Process Technology Developments For GaAs Ferroelectric Nonvolatile Memory" by L. E. Sanchez et al., and "Integrated Ferroelectrics" by J. F. Scott et al., in *Condensed Matter News*, Vol. 1, No. 3, 1992. This article also discloses the use of a silicon dioxide ($SiO_2$) layer between the silicon nitride and the PZT capacitor. However, while the article indicates that a successful memory was made using the process, it also suggests that, due to problems relating to the interaction of the ferroelectric material with the GaAs, one can expect the electronic properties to be at best the same, but, more likely, less than those of a comparable device built on a silicon substrate.

It is well-known, the process of spin coating has been used for making certain types of insulators in integrated circuits, such as spin-on glass (SOG). A carboxylate-based spin-on process has also been used for making metal oxides such as barium titanate, strontium titanate, and barium strontium titanate. See G. M. Vest and S. Singaram, "Synthesis of Metallo-organic Compounds For MOD Powders and Films", *Materials Research Society Symposium Proceedings*, Vol. 60, 1986, pp. 35–42, Robert W. Vest and Jiejie Xu, "$PbTiO_3$ Thin Films From Metalloorganic Precursors", *IEEE Transactions On Ultrasonics, Ferroelectrics, and Frequency Control*, Vol 35, No. 6, November 1988, pp. 711–717, and "Metalorganic Deposition (MOD): A Nonvacuum, Spin-on, Liquid-Based, Thin Film Method", *Materials Research Society Bulletin*, October 1989, pp. 48–53. However, the quality of the thin films made in these references was far too poor for use in integrated circuits, and these processes have, up to the time of the present invention, been used only for screen printing of metal oxide inks in making relatively macroscopic parts of circuits. Thus this spin-on technique did not appear to be a suitable candidate for a fabrication process which might produce state-of-the-art integrated circuit devices, such as high-capacitance, high-frequency thin film capacitors. Since the use of the GaAs substrate technology and the carboxylate spin-on technology both lead to less satisfactory results than, say, the silicon-based technology and deposition by sputtering, it would seem unlikely that their combination could lead to metal oxide thin film capacitors having high capacitance at high frequencies, i.e., at frequencies of 1 gigahertz and higher.

3. Solution to the Problem

The invention solves the problem of providing high-capacitance, high-frequency thin film capacitors by utilizing alkoxycarboxylate liquid precursors and a spin-on technique to deposit the metal oxide thin films on gallium arsenide substrates. Preferably the gallium arsenide is encapsulated by a barrier layer which prevents the volatilization of the GaAs in subsequent annealing steps at high temperature, which is in turn covered by a stress-reducing layer which lowers the stress between the gallium arsenide and the metal oxide capacitor. Preferably the barrier layer is comprised of silicon nitride ($Si_3N_4$) and the stress-reduction layer is comprised of silicon dioxide. Preferably a relatively low temperature spin-on process as described in co-owned U.S. patent application Ser. No. 08/165,082, now abandoned, incorporated herein by reference, is used to deposit the metal oxide.

The use of a liquid precursor spin-on process to deposit the metal oxide permits much more accurate control of the stoichiometry of the metal oxide and also results in a much more homogeneous material. This homogeneity and careful control of the drying and annealing processes leads to electronic properties are much better than for thin film devices fabricated by prior art methods. Further, the homogeneity of the metal oxides significantly reduces the stresses and cracking that accompanied prior art fabrication methods. Numerous other features, objects and advantages of the invention will become apparent from the following description when read in conjunction with the accompanying drawings.

DETAILED DESCRIPTION OF THE PREFERRED EMBODIMENT

Figure 1:
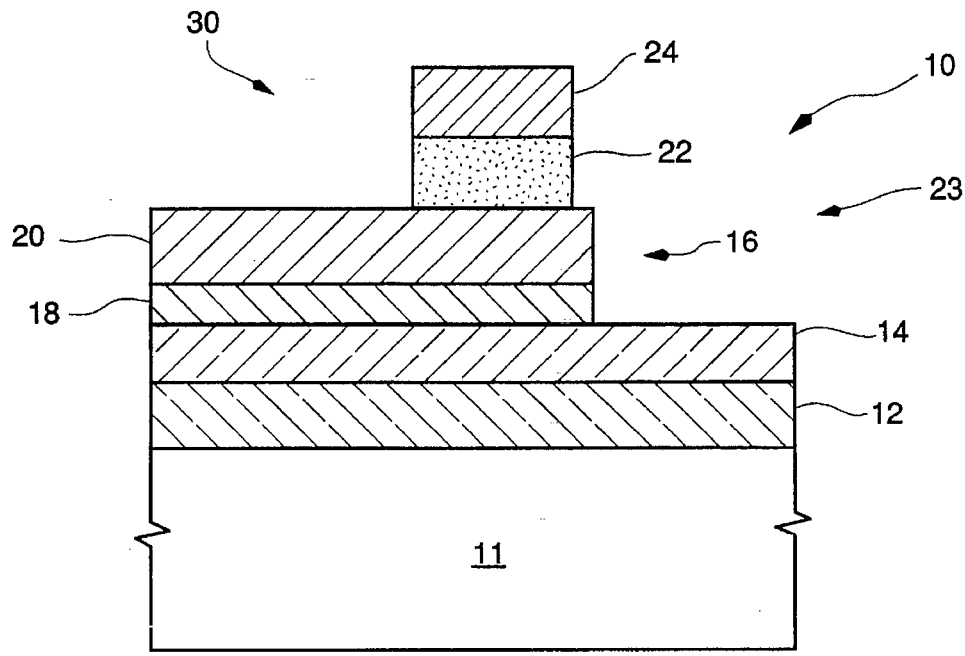
FIG. 1 is a cross-sectional view of an integrated circuit capacitor according to the invention.
Figure 2:
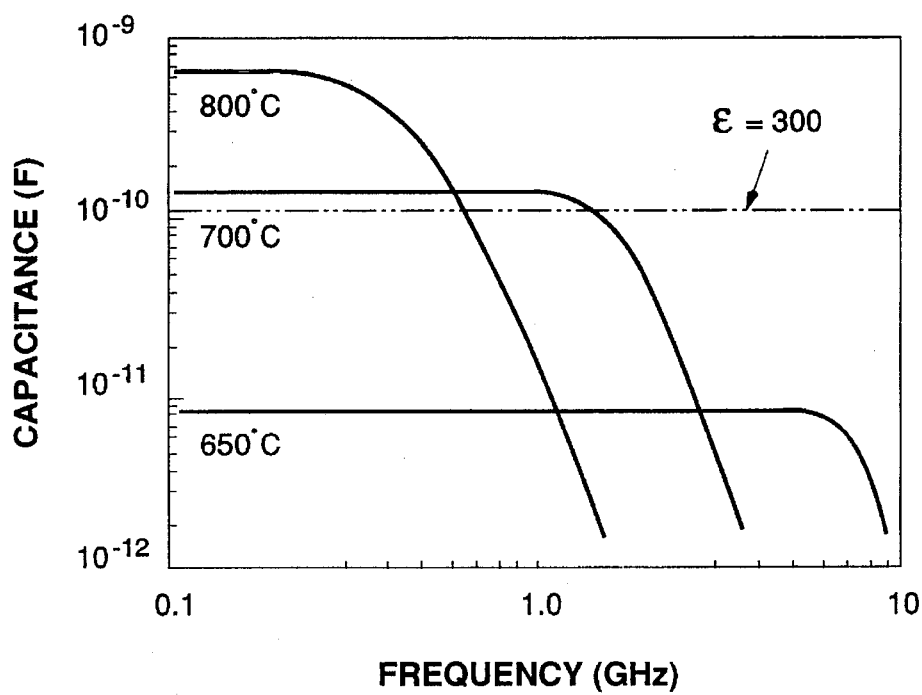
FIG. 2 is a graph of capacitance in farads (F) versus frequency in gigahertz (GHz) for BST capacitors fabricated according to the process of the invention and annealed at three different temperatures.

Turning to FIG. 1, a thin film capacitor 10 as fabricated in the examples discussed below is shown. The capacitor 10 is formed on a single crystal gallium arsenide (GaAs) wafer 11 encapsulated by a barrier layer 12, preferably of silicon nitride ($Si_3N_4$), and a stress-reduction layer 14, preferably of silicon dioxide. The capacitor 10 includes a first electrode 16 formed of an adhesion layer 18, preferably of titanium of about 200 Å, thickness, and a layer 20, preferably of platinum of about 2000 Å thickness. Capacitor 10 also includes a layer 22 of a metal oxide, such as BST, then a second electrode layer 24, also preferably about 2000 Å, thick and made of platinum.

In the integrated circuit art, the GaAs crystal 11 is often referred to as a "substrate". Herein, "substrate" may be used to refer to the GaAs layer 11, but more generally will refer to any support for another layer. For example, the substrate 23 for the metal oxide layer 22 is, immediately, the platinum first electrode layer 20, but also can interpreted broadly to include the layers 18, 14, 12 and 11 as well. The term "metal oxide" herein means a material of the general form $ABO_3$ where A and B are cations and O is the anion oxygen. The term is intended to include materials were A and B represent multiple elements; for example, it includes materials of the form $A'A''BO_3$, $AB'B''O_3$, and $A'A''B'B''O_3$, where A', A", B' and B" are different metal elements. Preferably, A, A', A", are metals selected from the group of metals consisting of Ba, Bi, Sr, Pb, Ca, and La, and B, B', and B" are metals selected from the group consisting of Ti, Zr, Ta, Mo, W, and Nb. Preferably the metal oxide is a perovskite. Many of these metal oxides are ferroelectrics, though some that are classed as ferroelectrics may not exhibit ferroelectricity at room temperature. However, since most such ferroelectrics have relatively high dielectric constants, these materials are often useful in high dielectric constant capacitors, whether or not they are ferroelectric. Preferably, the metal oxide is barium strontium titanate (BST) and preferably has the formula $Ba_{0.7}Sr_{0.3}TiO$. The BST may be doped as described in copending U.S. patent application Ser. No. 08/273,592, filed Jul. 11, 1994.

Many other materials may be used for any of the layers discussed above, such as layer 18 may comprise tantalum, nickel, tantalum silicide, titanium silicide, nickel silicide, palladium and other materials as well as titanium and layer 20 may be other materials as well as platinum. The electrode 16 may also be formed of more than two layers and the electrode 24 may be formed of more than one layer. Further, it should be understood that FIG. 1 is not meant to be an actual cross-sectional view of any particular portion of an actual electronic device, but are merely an idealized representation which is employed to more clearly and fully depict the structure and process of the invention than would otherwise be possible. For example, the relative thicknesses of the individual layers are not shown proportionately, since otherwise, some layers, such as the substrate 11 would be so thick as to make the drawing unwieldy. It should also be understood that the capacitor 10 preferably forms a portion of an integrated circuit 30 which includes other electronic devices, such as transistors, other capacitors etc., which other devices are not shown for clarity. In addition, the metal oxide layer 22 may be incorporated into other devices, such as ferroelectric FETe, as well as capacitors.

Figure 3:
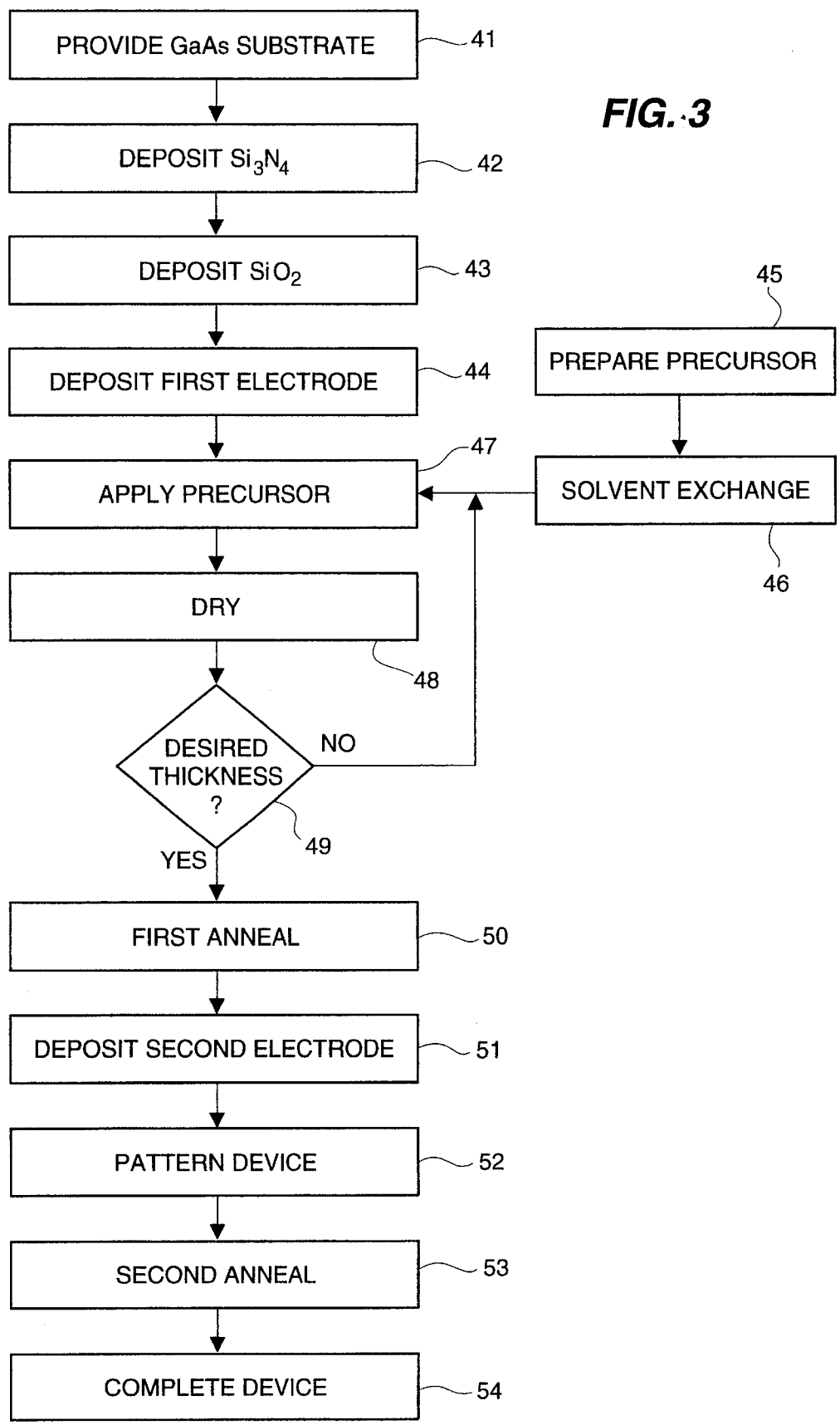
FIG. 3 is a flow chart of an exemplary process according to the invention for fabricating a thin-film capacitor.

Turning now to FIG. 3, a flow chart of the process for fabricating capacitors 10 according to the invention is shown. The process shall be discussed in terms of the embodiment of FIG. 1, but could just as well be discussed in terms of the other embodiments also. In step 41 a GaAs substrate 11 is provided. This substrate 11 is made according to conventional methods of growing GaAs crystals. In step 42 a layer of silicon nitride of about 1500 Å thick is deposited, preferably by plasma enhanced chemical vapor deposition (PECVD), although other methods may also be used. Then a layer 14 of silicon dioxide about 1000 Å thick is deposited in step 43, by any conventional method, such as PECVD or wet growth in step 44 a first electrode 16 is deposited. Preferably first electrode 16 comprises an adhesion layer 18, preferably of titanium and about 200 Å thick, and a layer 20 of platinum about 2000 Å thick, both deposited preferably by sputtering. A metal oxide precursor is prepared in step 45; this may be just prior to the application step 47, but usually a stock solution is prepared and stored well prior to the application. The metal oxide is preferably barium strontium titanate, and the precursor is prepared as described in U.S. Pat. No. 5,514,822, which is hereby incorporated by reference. The foregoing patent application discloses a method of making a metal oxide which utilizes the combination of a metal alkoxycarboxylate, such as a barium alkoxycarboxylate, and a metal alkoxide, such as titanium isopropoxide. Specifically, a BST precursor is made by reacting barium with 2-methoxyethanol and 2-ethylhexanoic acid, adding strontium, allowing the mixture to cool, adding titanium isopropoxide and 2-methoxyethanol, and heating to obtain a final BST concentration of about 0.5 moles. These precursors are heated sufficiently to remove any water from the solutions, and may be provided with metallic moieties capable of forming other solid metal oxides such as strontium titanate, barium titanate, and strontium bismuth niobate, upon thermal treatment of the precursor solution. If a dopant is to be added, a dopant precursor solution is prepared and added to the precursor in step 45.

A precursor for barium strontium titanate (BST) having the formula $Ba_{0.7}Sr_{0.3}TiO_3$ was formulated as follows. The compounds shown in Table I were measured.

TABLE I

| Compound | FW | g | mmole | Equiv. |
|---|---|---|---|---|
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 1.44.21 | 8.5005 | 88.945 | 0.6010 |
| Titanium Isopropoxide | 284.26 | 27.878 | 98.072 | 1.0000 |

In the above table, "FW" indicates formula weight, "g" indicates grams, "mmoles" indicates millimoles, and "Equiv." indicates the equivalent number of moles in solution. The barium was placed in 100 ml (milliliters) of 2-methoxyethanol, the 2-ethylhexanoic acid was added and the mixture allowed to react while stirring. The step may also be performed by placing the barium in the 2-methoxyethanol, allowing it to react, adding the 2-ethylhexanoic acid, and stirring while it reacts. The reaction of the barium heated the solution. While the solution was still hot, the strontium was added and allowed to react. When the strontium was all reacted, then the second measure of 2-ethylhexanoic acid was added and, while stirring, the solution was heated to a maximum temperature of 115° C. This ensures that all water is distilled out. It is noted that this precursor and others discussed below were made at atmospheric pressure at Colorado Springs, Colo. The mixture was then allowed to cool, and the titanium isopropoxide was added followed by the addition of enough 2-methoxyethanol to make 220 ml total solution. The solution was then heated and stirred with a maximum temperature of 116° C. The solution was then diluted to 200 ml total solution with additional 2-methoxyethanol. The result was a final BST precursor of 0.490 Moles concentration with the ratio of barium to strontium equal to 0.69986:0.30014.

Just prior to the application step, a solvent exchange step 46 is preferably performed. That is, a stock solution prepared as above is removed from storage, and the solvent that is convenient for manufacturing and/or which makes a precursor that stores well, such as xylene, is exchanged for a solvent that has a good viscosity for the application process, such n-butyl acetate for a spinning application process. The exchange is performed by adding the new solvent and distilling out the old. Preferably, for a spin-on process the concentration of the spin-on precursor solution is 0.29–0.31 moles, which is controlled at the solvent exchange step 46. In step 47 the precursor is applied to the substrate 23, preferably by spinning at 1500 RPM to 2000 RPM for 20 seconds to 60 seconds. However, other application methods may be used, for example, a misted deposition process as described in U.S. patent application Ser. No. 07/993,380, which is hereby incorporated by reference. In steps 48 and 50, the precursor is treated to form the metal oxide dielectric material 22 on substrate 23. The treating is preferably by drying and annealing. The drying is preferably in air or dry nitrogen, and preferably at a relatively high temperature as compared to the prior art, i.e. at from 200° C. to 500° C. Typically it is performed at 400° C. for 2 minutes in air. This high temperature drying step has been found to be essential to obtain predictable properties in BST. After drying, if the film 22 is not of the desired thickness, the application and drying steps 47 and 48 are repeated until the desired thickness is reached. Usually two to three repetitions of steps 47 and 48 are required to reach the thickness of about 2000 Å. When the desire thickness is obtained, the dried precursor is annealed in step 50 to form dielectric 22. The annealing is referred to as the 1st anneal to distinguish it from a later anneal. The anneal is preferably performed in oxygen at a temperature of from 600° C. to 850° C. for from 1 minute to 90 minutes. Typically, it is performed at 700° C. for 60 minutes in $O_2$ in a push/pull process including 10 minutes for the "push" into the furnace and 10 minutes for the "pull" out of the furnace. Careful control of this anneal temperature and time is also essential for predicable results. The resulting layer 22 is preferably about 2000 Å thick. In step 51 a second electrode 24 is deposited, preferably by sputtering, and preferably formed of about 2000 Å thick platinum. The device is then patterned in step 52, which may comprise only the patterning of the second electrode if any patterning was done after deposition of the first electrode. It is important that the device be patterned before the second anneal step 53 so that patterning stresses are removed by the anneal and any oxide defects created by the patterning are corrected. The second anneal 53 is preferably performed at the same temperature as the first anneal though variance within a small temperature range of 50° C. to 100° C. about the first anneal temperature is possible. The time for the second anneal is preferably less than for the first anneal, generally being about 30 minutes, though again a range of times from about 1 minute to 90 minutes is possible depending on the sample. Again, careful control of the anneal parameters is important to obtain predictable results. In some instances it is desirable to skip the second anneal altogether. Finally, in step 54 the device is completed and evaluated.

Three samples of a BST capacitor 10 were made from a stock precursor solution having a stoichiometric content of barium, strontium and titanium as specified in the formula $Ba_{0.7}Sr_{0.3}TiO$. The process was as described above, except that for the first sample the first and second and second anneal steps were performed at 800° C., in the second sample the first and second anneal steps were performed at 700° C., and in the third sample the first and second anneal steps were performed at 650° C. The electrical properties of the samples were evaluated with results as shown in FIG. 3, a graph of capacitance in farads versus frequency in gigahertz. To provide a basis of comparison, the dotted horizontal line shows the capacitance for an ideal material with dielectric constant, $\epsilon$, of 300. The capacitance of the sample annealed at 800° C. drops off sharply as the frequency approaches 1 gigahertz. The capacitance of the sample annealed at 700° C. does not drop off until beyond 1 gigahertz, and the capacitance of the sample annealed at 650° C. continues flat out to nearly 10 gigahertz. However, the value of the capacitance drops by about a factor of about 5 between the sample annealed at 800° C. and the sample annealed at 700° C., and by another factor of a little over 10 between the sample annealed at 700° C. and the sample annealed at 650° C. As indicated by the dotted line, for the sample annealed at 700° C., the capacitance is still significantly higher than the capacitance, say for silicon dioxide, which is has a dielectric constant of about 3.9, thus using the process of the invention, it is possible to fabricate a material that has a high capacitance well beyond 1 gigahertz.

There has been described novel structures and processes for fabricating integrated circuits having high-capacitance, high-frequency thin film capacitors. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, other capacitor structures than that shown in FIG. 1 maybe used and the capacitors and process of making them may be combined with a wide variety of other structures and processes. Equivalent materials, different material thicknesses, and other methods of depositing the substrate and electrode layers may be used. It is also evident that the process steps recited may in some instances be performed in a different order. Or equivalent structures and processes may be substituted for the various structures and processes described.

We claim:

1. A method of fabricating a high capacitance thin film integrated circuit capacitor device, said method comprising the steps of:

providing a gallium arsenide substrate;

forming a barrier layer on said substrate;

forming a first electrode;

providing a metalorganic liquid precursor comprising barium, strontium, and titanium metals in effective amounts for yielding a solid dielectric barium strontium titanate upon treating of said liquid precursor;

applying said liquid precursor on said first electrode;

treating said liquid precursor on said first electrode to form a thin film of said barium strontium titanate, wherein said treating step includes a step of annealing a dried form of said liquid precursor on said first electrode at a temperature ranging from 600° C. to 850° C. for a time ranging from one minute to ninety minutes to provide an essentially flat capacitance in said barium strontium titanate at frequencies within the interval from 0.1 to 0.2 gigahertz; and forming a second electrode on said barium strontium titanate to complete said integrated circuit capacitor.

2. A method as in claim 1 and further comprising the step of forming a stress reduction layer between said steps of forming a barrier layer and forming a first electrode.

3. A method as in claim 2 wherein said stress reduction layer comprises silicon dioxide.

4. A method as in claim 3 wherein said silicon dioxide layer is of about 1000 Å thickness.

5. A method as in claim 1 wherein said barrier layer comprises $Si_3N_4$.

6. A method as in claim 5 wherein said $Si_3N_4$ is of about 1500 Å thickness.

7. The method as in claim 1 wherein said step of applying comprises placing a coat of said liquid precursor on said first electrode in a sufficient amount to provide a thickness of less than about 1000 Å of said barium strontium titanate per coat.

8. A method as in claim 8 wherein said step of treating comprises heating said precursor on said electrode to a temperature of from 200° C. to 500° C. prior to said step of annealing.

9. A method as in claim 8 wherein said step of treating comprises heating the precursor on said electrode to a temperature of about 400° C. in air or nitrogen gas.

10. A method as in claim 1 wherein said step of annealing includes said temperature ranging from 600° C. to 700° C.

11. A method as in claim 1 wherein said step of annealing includes said temperature ranging from 600° C. to 650° C.

12. A method as in claim 1 and further including a second anneal of said barium strontium titanate for a time between 1 minute and 90 minutes.

13. A method as in claim 1 wherein said step of treating comprises drying said precursor and further including the step of repeating said steps of applying and drying said precursor two or more times until said barium strontium titanate has obtained a desired thickness.

14. A method as in claim 1 wherein said barium strontium titanate has the formula $Ba_{0.7}Sr_{0.3}TiO_3$.

15. A method as in claim 1 wherein said precursor comprises a metal alkoxycarboxylate.

16. A method as in claim 15 wherein said precursor further comprises a metal alkoxide.

* * * * *

UNITED STATES PATENT AND TRADEMARK OFFICE
CERTIFICATE OF CORRECTION

PATENT NO.   :   5,620,739

DATED        :   April 15, 1997

INVENTOR(S)  :   Azuma et al.

It is certified that error appears in the above-identified patent and that said Letters Patent is hereby corrected as shown below:

Column 7    Line 13 change "claim 8" to read --claim 1--

Signed and Sealed this

Twenty-second Day of July, 1997

Attest:

BRUCE LEHMAN

Attesting Officer

Commissioner of Patents and Trademarks